US012772469B2

(12) United States Patent
Lin et al.

(10) Patent No.: US 12,772,469 B2
(45) Date of Patent: Oct. 20, 2026

(54) INTERPOSER WITH MIM CAPACITOR AND FABRICATING METHOD OF THE SAME

(71) Applicant: UNITED MICROELECTRONICS CORP., Hsin-Chu City (TW)

(72) Inventors: Da-Jun Lin, Kaohsiung City (TW); Bin-Siang Tsai, Changhua County (TW); Fu-Yu Tsai, Tainan City (TW); Tai-Cheng Hou, Tainan City (TW); Chung-Yi Chiu, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 382 days.

(21) Appl. No.: 18/407,409

(22) Filed: Jan. 8, 2024

(65) Prior Publication Data

US 2025/0194118 A1 Jun. 12, 2025

(30) Foreign Application Priority Data

Dec. 8, 2023 (CN) ......................... 202311687198.0

(51) Int. Cl.

| | |
|---|---|
| ***H10D 1/68*** | (2025.01) |
| ***H10W 20/00*** | (2026.01) |
| ***H10W 20/20*** | (2026.01) |
| ***H10W 20/40*** | (2026.01) |
| ***H10W 70/63*** | (2026.01) |
| ***H10W 72/00*** | (2026.01) |
| ***H10W 72/20*** | (2026.01) |

(52) U.S. Cl.

CPC .......... *H10D 1/692* (2025.01); *H10W 20/023* (2026.01); *H10W 20/20* (2026.01); *H10W 20/496* (2026.01); *H10W 70/635* (2026.01); *H10W 72/07236* (2026.01); *H10W 72/252* (2026.01)

(58) Field of Classification Search

CPC .... H10D 1/692; H10W 20/023; H10W 20/20; H10W 20/496; H10W 70/635; H10W 70/685; H10W 72/07236; H10W 72/252; H10W 44/601

See application file for complete search history.

(56) References Cited

U.S. PATENT DOCUMENTS 8,420,478 B2 * 4/2013 Chiang .............. G11C 13/0007 438/238
8,803,286 B2 8/2014 Jou
9,960,106 B2 * 5/2018 Chen .................. H10W 70/685
10,381,302 B2 8/2019 Shih
2010/0224960 A1 * 9/2010 Fischer ............... H10W 20/496 257/532

* cited by examiner

*Primary Examiner* — Dale E Page
*Assistant Examiner* — Quovaunda Jefferson
(74) *Attorney, Agent, or Firm* — Winston Hsu

(57) ABSTRACT

An interposer with an MIM capacitor includes a substrate. A redistribution layer is disposed on the substrate. A first copper pillar, a second copper pillar and a third copper pillar are disposed on the redistribution layer. The first copper pillar and the third copper pillar respectively electrically connect to the redistribution layer. An MIM capacitor covers and contacts the first copper pillar and the second copper pillar. A first bonding bump is disposed directly on the third copper pillar and electrically connects to the third copper pillar. A second bonding bump is disposed directly on the second copper pillar and electrically connects to the MIM capacitor.

11 Claims, 3 Drawing Sheets

INTERPOSER WITH MIM CAPACITOR AND FABRICATING METHOD OF THE SAME

BACKGROUND OF THE INVENTION

1. Field of the Invention

The present invention relates to an interposer, in particular to an interposer with a metal-insulator-metal (MIM) capacitor and a fabricating method of the same.

2. Description of the Prior Art

With the development of the electronics industry, electronic products become thinner, lighter, and smaller. Therefore, semiconductor chips are demanded to have high performance, high functionality, and high speed. Generally speaking, the most direct way to miniaturize semiconductor wafers is by the improvement of lithography technology. However, lithography technology is approaching its physical limit, so the solution must be shifted from the horizontal scale to the vertical scale.

Compared with the early pin-fixed substrates and chips, in order to increase the number of I/O and meet reliable heat dissipation, many new packaging technologies have been developed to reduce the size of the chip and increase the number of solder contacts. Currently, ball grid array can be bonded by wire bonding or flip chip bonding. Flip chip bonding is a technology that uses for face-down bonding, which can reduce costs.

As the circuit patterns of semiconductor chips shrink to nanometers in size, more computing functions and a larger number of transistor components are integrated on chips, therefore the number of signal pins (I/O) is increased. This makes traditional chip packaging technology encounter extremely severe challenges.

SUMMARY OF THE INVENTION

In view of this, the present invention provides an interposer for three-dimensional stacked package, thereby increasing the performance of semiconductor chips.

According to a preferred embodiment of the present invention, an interposer with an MIM capacitor includes a substrate. A redistribution layer is disposed on the substrate. A first copper pillar, a second copper pillar and a third copper pillar are disposed on the redistribution layer, wherein the first copper pillar and the third copper pillar respectively electrically connect to the redistribution layer. An MIM capacitor covers and contacts the first copper pillar and the second copper pillar. A first bonding bump is disposed directly on the third copper pillar and electrically connects to the third copper pillar. A second bonding bump is disposed directly on the second copper pillar and electrically connects to the MIM capacitor.

A fabricating method of an interposer with an MIM capacitor includes providing a substrate. Next, a redistribution layer is formed on the substrate. Later, a first copper pillar, a second copper pillar and a third copper pillar are simultaneously formed on the redistribution layer, wherein the first copper pillar and the third copper pillar respectively electrically connect to the redistribution layer. Then, a first conductive layer, an insulating layer and a second conductive layer are formed in sequence, wherein the first conductive layer, the insulating layer and the second conductive layer cover the first copper pillar, the second copper pillar and the third copper pillar from bottom to top. Subsequently, the first conductive layer, the insulating layer and the second conductive layer are segmented to form an interval between the first copper pillar and the third copper pillar so as to make the first conductive layer, the insulating layer and the second conductive layer which cover the first copper pillar and the second copper pillar form an MIM capacitor, and the first conductive layer, the insulating layer and the second conductive layer cover the third copper pillar form a stacked structure. Finally, a first bonding bump and a second bonding bump are formed. The first bonding bump is disposed directly on the third copper pillar and electrically connects to the third copper pillar, and the second bonding bump is disposed directly on the second copper pillar and electrically connects to the MIM capacitor.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 6 depict a fabricating method of an interposer with an MIM capacitor according to a preferred embodiment of the present invention, wherein:

FIG. 1 depicts a substrate with a redistribution layer thereon;

FIG. 2 is a fabricating stage in continuous of FIG. 1;

FIG. 3 is a fabricating stage in continuous of FIG. 2;

FIG. 4 is a fabricating stage in continuous of FIG. 3;

FIG. 5 is a fabricating stage in continuous of FIG. 4; and

FIG. 6 is a fabricating stage in continuous of FIG. 5.

DETAILED DESCRIPTION

FIG. 1 to FIG. 6 depict a fabricating method of an interposer with an MIM capacitor according to a preferred embodiment of the present invention.

Figure 1:
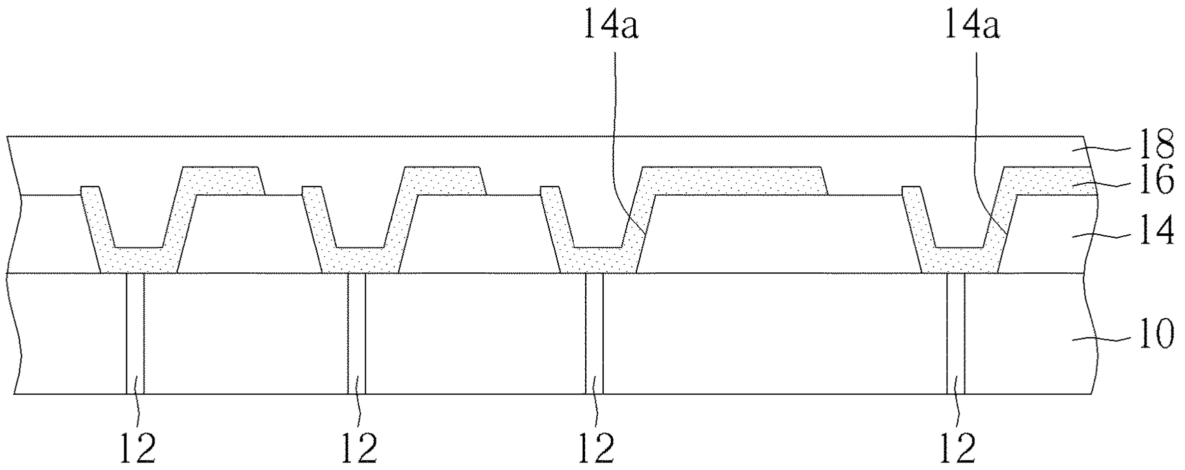

As shown in FIG. 1, a substrate 10 is provided. The substrate 10 can be silicon, glass or a dielectric layer. Numerous through vias 12 penetrate the substrate 10. Then, a dielectric layer 14 is formed to cover the substrate 20, and the dielectric layer 14 is etched to form numerous openings 14*a* to expose the through vias 12. Later, one or more redistribution layers 16 are formed on the substrate 10 and filled in the openings 14*a* to contact and electrically connect the through vias 12. Next, a dielectric layer 18 is formed to cover the redistribution layer 16 and the dielectric layer 14.

Figure 2:
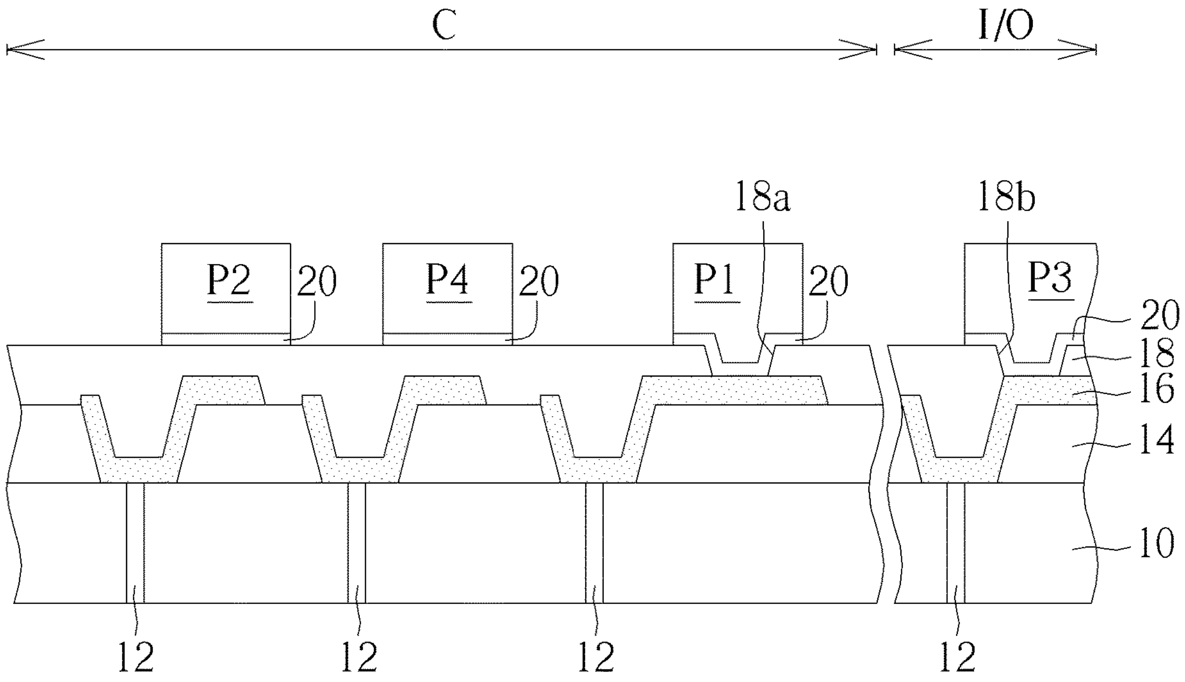

As shown in FIG. 2, a first copper pillar P1, a second copper pillar P2, a third copper pillar P3 and a fourth copper pillar P4 are formed on the redistribution layer 16 simultaneously. The first copper pillar P1 and the third copper pillar P3 respectively electrically connect to the redistribution layer 16. In details, the manufacturing process of copper pillars preferably includes etching the dielectric layer 18 to form the openings 18*a*/18*b*, and the redistribution layer 16 is exposed through the openings 18*a*/18*b*. Then, an under-bump metallization (UBM) material layer is formed to cover the dielectric layer 18 and fill the openings 18*a*/18*b*. Later, a patterned photoresist (not shown) is formed. The patterned photoresist has four openings that define the positions of the copper pillars. The openings in the patterned photoresist expose the UBM material layer. An electroplating process is then performed to form a first copper pillar P1, a second copper pillar P2, a third copper pillar P3 and a fourth copper pillar P4 respectively in the openings of the patterned photoresist. Finally, the patterned photoresist is removed, and the UMB material layer that is not covered by the first copper pillar P1, the second copper pillar P2, the third copper pillar P3 and the fourth copper pillar P4 is removed to form four UMB layers 20. According to the preferred embodiment of the present invention, the first copper pillar P1, the second copper pillar P2 and the fourth copper pillar P4 are disposed in the same region, such as a capacitor region C. The third copper pillar P3 is disposed in an input/output region I/O. In addition, according to different requirements, the number of the copper pillars and the UBM layer 20 can be adjusted. In addition, the material of the UBM layer 20 includes copper, chromium, nickel, aluminum, gold, silver, tungsten, titanium, tantalum, tin, platinum, palladium, titanium nitride (TiN), titanium tungsten (TiW), tantalum nitride (TaN), nickel vanadium (NiV) or chromium copper (CrCu). The redistribution layer 16 includes aluminum, gold, nickel or other conductive materials.

Figure 3:
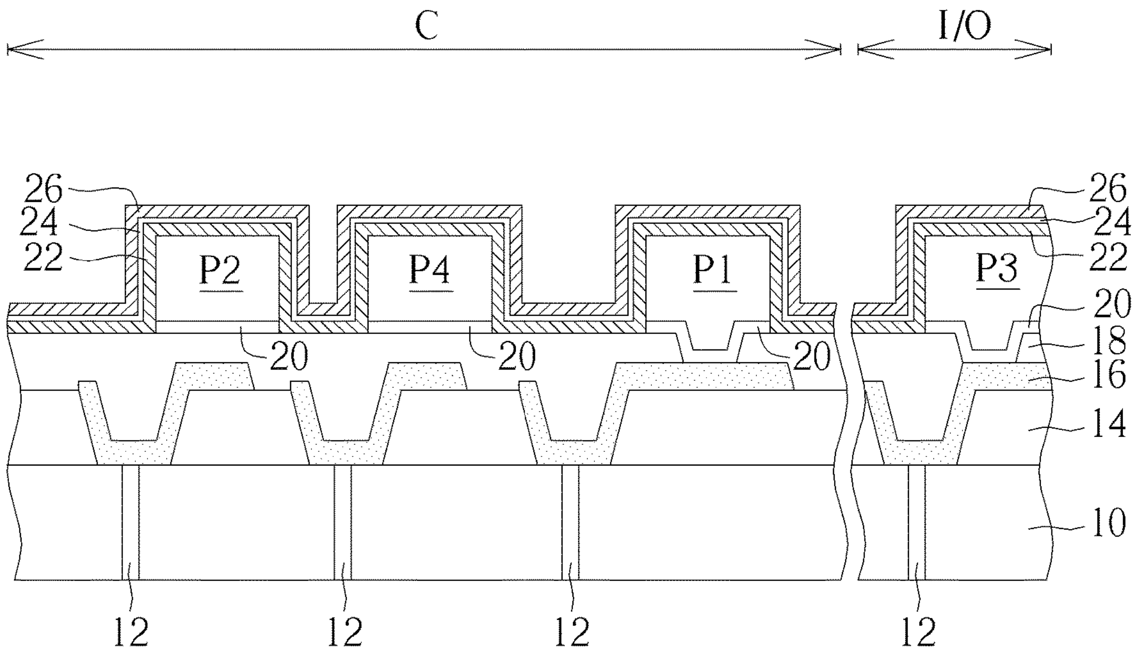

As shown in FIG. 3, a first conductive layer 22, an insulating layer 24 and a second conductive layer 26 are formed in sequence. The first conductive layer 22, the insulating layer 24 and the second conductive layer 26 cover the first copper pillar P1, the second copper pillar P2, the third copper pillar P3 and the fourth copper pillar P4 from bottom to top. The first conductive layer 22 includes titanium nitride or tantalum nitride, and the second conductive layer 26 includes nickel, cobalt or cobalt-tungsten alloy. The insulating layer 24 includes aluminum oxide, zirconium oxide, barium strontium titanate (BST), lead zirconate titanate (PZT), zirconium silicate ($ZrSiO_4$), hafnium silicon oxide ($HfSiO_2$), oxynitride Hafnium silicon (HfSiON), tantalum oxide or a combination of the above materials.

Figure 4:
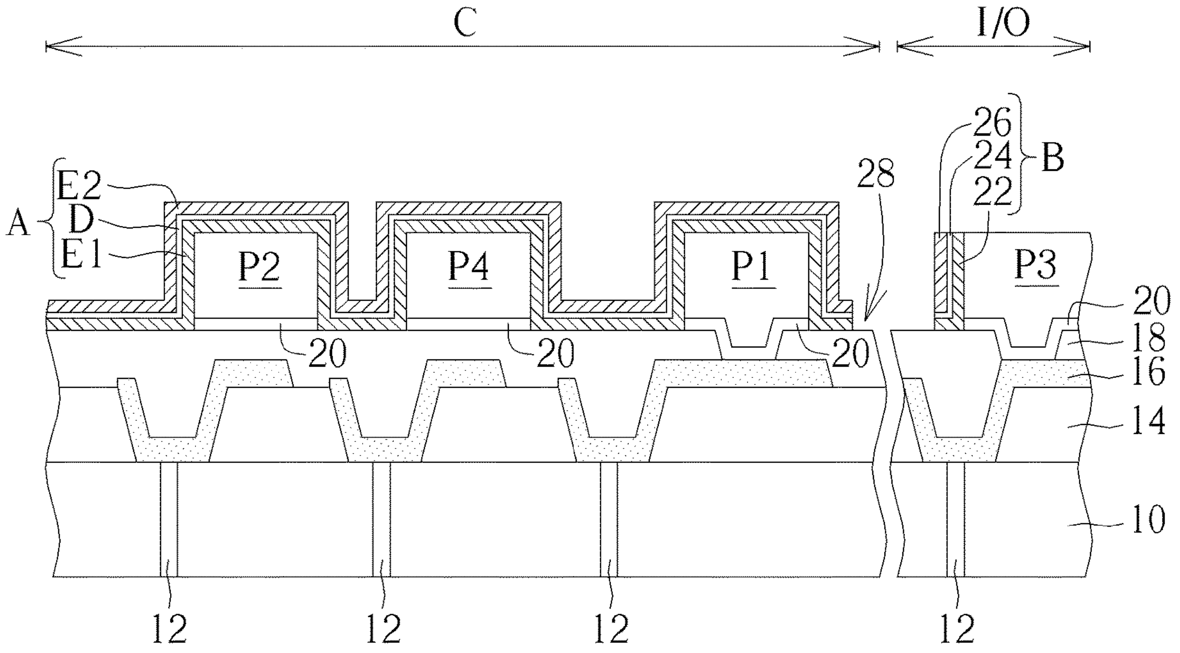

As shown in FIG. 4, the first conductive layer 22, the insulating layer 24 and the second conductive layer 26 are patterned to form an MIM capacitor A and a stacked structure B. In details, the first conductive layer 22, the insulating layer 24 and the second conductive layer 26 are segmented to form an interval 28 between the first copper pillar P1 and the third copper pillar P3. The interval 28 is used to separate the first conductive layer 22, the insulating layer 24 and the second conductive layer 26 in the capacitor region C and the input/output region I/O to make the first conductive layer 22, the insulating layer 24 and the second conductive layer 26 which cover the first copper pillar P1 and the second copper pillar P2 within the capacitor region C form the MIM capacitor A. The first conductive layer 22 serves as a bottom electrode E1, the insulating layer 24 serves as a capacitor dielectric layer D, and the second conductive layer 26 serves as a top electrode E2. The first conductive layer 22, the insulating layer 24 and the second conductive layer 26 covering the third copper pillar P3 within the input/output region I/O form a stacked structure B. The first conductive layer 22, the insulating layer 24 and the second conductive layer 26 can be segmented by an etching process. During the etching process, the first conductive layer 22, the insulating layer 24 and the second conductive layer 26 covering the top surface of the third copper pillar P3 are also removed at the same time.

Figure 5:
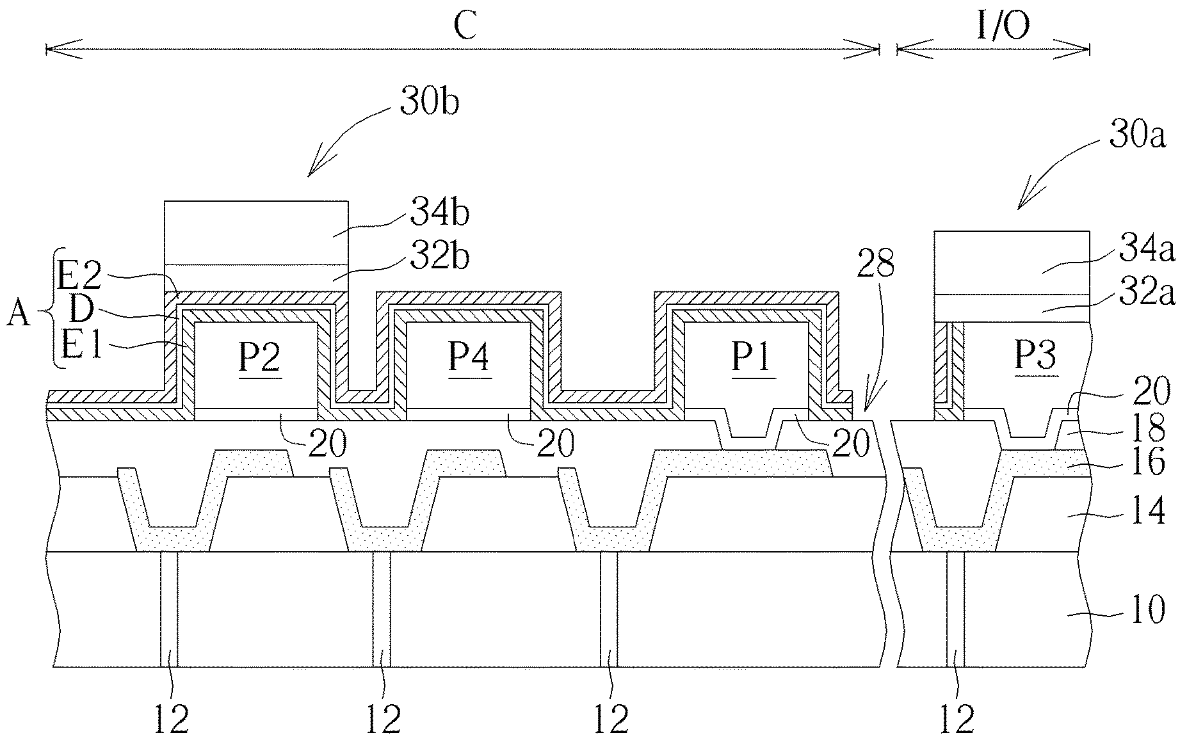
Figure 6:
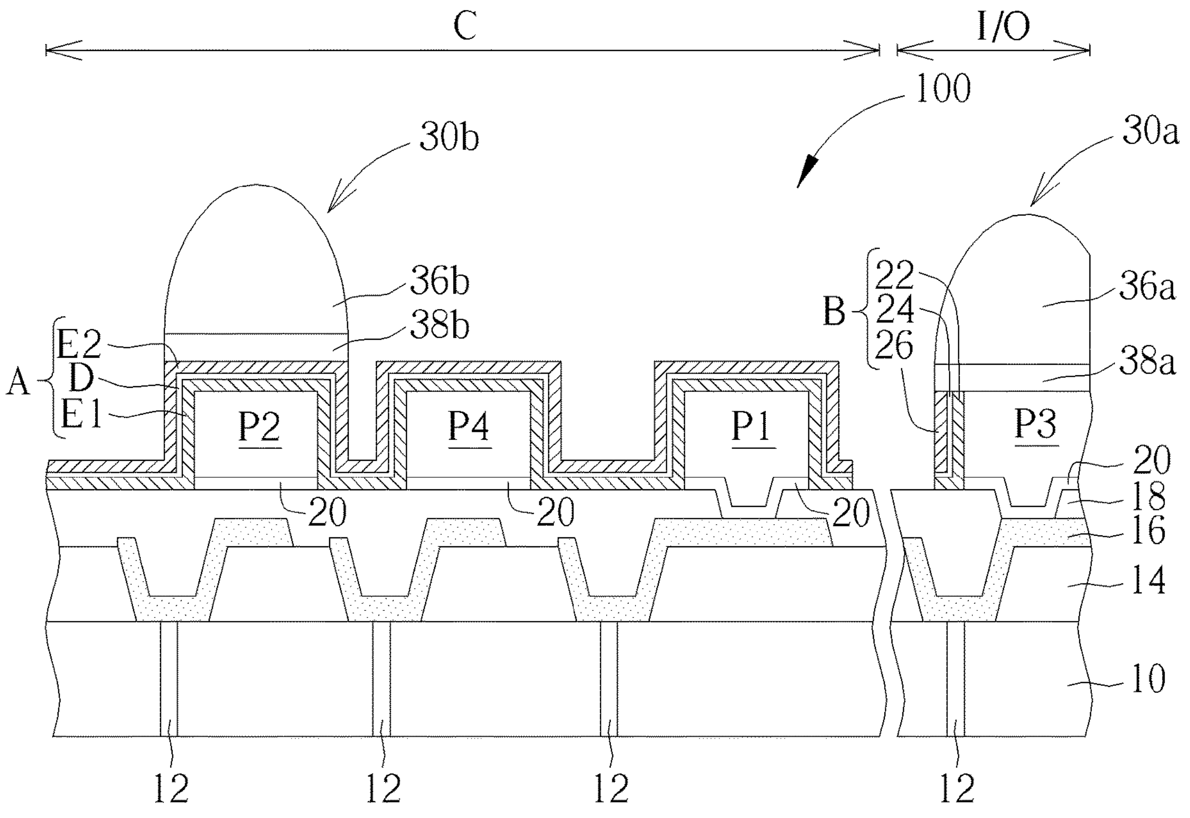

As shown in FIG. 5 and FIG. 6, a first bonding bump 30*a* and a second bonding bump 30*b* are formed simultaneously. The first bonding bump 30*a* is disposed directly on the third copper pillar P3 and electrically connects to the third copper pillar P3. The second bonding bump 30*b* is disposed directly on the second copper pillar P2 and electrically connects to the MIM capacitor A. Specifically, as shown in FIG. 5, the fabricating steps of the first bonding bump 30*a* and the second bonding bump 30*b* include forming a first nickel layer 32*a* and a second nickel layer 32*b*. The first nickel layer 32*a* covers and contacts the top surface of the third copper pillar P3. The second nickel layer 32*b* covers and contacts the MIM capacitor A on the second copper pillar P2. Next, a first solder paste 34*a* and a second solder paste 34*b* are formed to cover the first nickel layer 32*a* and the second nickel layer 32*b* respectively. As shown in FIG. 6, a reflow process is performed so that the first solder paste 34*a* and the second solder paste 34*b* are transformed into a first solder ball 36*a* and a second solder ball 36*b*. The first nickel layer 32*a* and the second nickel layer 32*b* react with tin to form a first intermetallic compound layer 38*a* and a second intermetallic compound layer 38*b*. The first intermetallic compound layer 38*a* and the second intermetallic compound layer 38*b* preferably include silicon-nickel Alloy or silicon-nickel-copper alloy. Now, an interposer 100 with an MIM capacitor of the present invention is completed. The interposer 100 with an MIM capacitor of the present invention can be used to bond with a chip, a substrate or a circuit board to increase the packaging density of the product.

As shown in FIG. 6, an interposer 100 with an MIM capacitor includes a substrate 10. The substrate 10 can be silicon, glass or a dielectric layer. Numerous through vias 12 penetrate the substrate 10. There is preferably no active component such as a transistor in the substrate 10. Moreover, not only the through vias 12 can be used as connection lines in the interposer 100, a redistribution layer (not shown) can alternatively be embedded in the substrate 10 as a connection line. In the present invention, several through vias 12 are taken as an example. A redistribution layer 16 is disposed on the substrate 10. A first copper pillar P1, a second copper pillar P2, a third copper pillar P3 and a fourth copper pillar P4 are disposed on the redistribution layer 16. The first copper pillar P1, the second copper pillar P2 and the fourth copper pillar P4 are located in the capacitor region C, and the third copper pillar P3 is located in the input/output region I/O. The first copper pillar P1 and the third copper pillar P3 are respectively electrically connected to the redistribution layer 16. Both the second copper pillar P2 and the fourth copper pillar P4 are isolated from the redistribution layer 16. UBM layers 20 are respectively disposed directly below the first copper pillar P1, the second copper pillar P2, the third copper pillar P3 and the fourth copper pillar P4. An MIM capacitor A covers and contacts the first copper pillar P1, the second copper pillar P2 and the fourth copper pillar P4. A stacked structure B covers and contacts the sidewall of the third copper pillar P3. The MIM capacitor A does not contact the third copper pillar P3. A first bonding bump 30*a* is disposed directly on the third copper pillar P3 and electrically connects to the third copper pillar P3. A second bonding bump 30*b* is disposed directly on the second copper pillar P2 and electrically connects to the MIM capacitor A.

The MIM capacitor A includes a bottom electrode E1, a capacitor dielectric layer D and a top electrode E2 stacked in sequence from bottom to top. The bottom electrode E1 contacts the first copper pillar P1, the second copper pillar P2 and the fourth copper pillar P4, and the top electrode E2 contacts the second bonding bump 30*b*. The second copper pillar P2 and the fourth copper pillar P4 are not used for external connection to other circuits. The second copper pillar P2 and the fourth copper pillar P4 are used to increase the surface area of the MIM capacitor A, thereby increasing the capacitance. According to different requirements, the number of the first copper pillar P1, the second copper pillar P2, and the fourth copper pillar P4 can be adjusted. Generally, the more copper pillars are in the capacitor region C, the higher capacitance of the MIM capacitor A becomes. The stacked structure B is stacked by a first conductive layer 22, an insulating layer 24 and a second conductive layer 26. The first conductive layer 22 contacts the third copper pillar P3, and the insulating layer 24 is sandwiched between the first conductive layer 22 and the second conductive layer 26. As described in the previous process, the bottom electrode E1 is formed by segmenting the first conductive layer 22, therefore material of the first conductive layer 22 is the same as material of the bottom electrode E1. The capacitor dielectric layer D is formed by segmenting the insulating layer 24, so material of the insulating layer 24 is the same as material of the capacitor dielectric layer D. The top electrode E2 is formed by segmenting the second conductive layer 26, so material of the second conductive layer 26 is the same as material of the top electrode E2. The first bonding bump 30*a* and the second bonding bump 30*b* both include tin. The bottom electrode E1 includes titanium nitride or tantalum nitride, and the top electrode E2 includes nickel, cobalt or cobalt-tungsten alloy.

The third copper pillar P3 and the first bonding bump 30*a* are the terminals of the interposer 100 used to externally connect to another chip or substrate. The first copper pillar P1 is used to electrically connect the bottom electrode E1 and the redistribution layer 16. Furthermore, the first copper pillar P1, the second copper pillar P2 and the fourth copper pillar P4 are all convex contours, so they can increase the surface area of the MIM capacitor A. Because the first copper pillar P1, the second copper pillar P2, the third copper pillar P3 and the fourth copper pillar P4 are manufactured by the same process, no additional process steps are added. Generally speaking, micro-bumps are composed of copper pillars and bonding bumps. For example, the third copper pillar P3 and the first bonding bump 30*a* together form a micro-bump. In the present invention, the MIM capacitor A is disposed within the micro-bump, that is, between the second copper pillar P2 and the second bonding bump 30*b*. The MIM capacitor A is outside the redistribution layer 16 and does not contact the redistribution layer 16.

The present invention provides an MIM capacitor on the interposer, therefore when the interposer is used in chip on chip package or chip on wafer package, the electronic signals between the chips on both sides of the interposer or between the chip and the substrate can be separated. Furthermore, in the present invention, the first conductive layer is used to contact the copper pillar, and the first conductive layer is titanium nitride or tantalum nitride. Because the first conductive layer is titanium nitride or tantalum nitride, the first conductive layer not only serves as the bottom electrode, but also can be used to avoid the protrusion or breakage of the copper pillars due to the migration of copper atoms. In addition, the present invention uses the second conductive layer as the top electrode. The second conductive layer contacts the intermetallic compound layer, and because the second conductive layer is nickel, cobalt or cobalt-tungsten alloy, the second conductive layer can act as a buffer layer to avoid the diffusion of tin atoms. Moreover, because nickel, cobalt or cobalt-tungsten alloy has a high work function, the second conductive layer can cause a large band gap difference in the capacitor dielectric layer, thereby reducing the current leakage of the MIM capacitor.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An interposer with a metal-insulator-metal (MIM) capacitor, comprising:
- a substrate;
- a redistribution layer disposed on the substrate;
- a first copper pillar, a second copper pillar and a third copper pillar disposed on the redistribution layer, wherein the first copper pillar and the third copper pillar respectively electrically connect to the redistribution layer;
- an MIM capacitor covering and contacting the first copper pillar and the second copper pillar, wherein the MIM capacitor does not contact the third copper pillar;
- a first bonding bump disposed directly on the third copper pillar and electrically connecting to the third copper pillar; and
- a second bonding bump disposed directly on the second copper pillar and electrically connecting to the MIM capacitor.

2. The interposer with an MIM capacitor of claim 1, further comprising a fourth copper pillar disposed between the first copper pillar and the second copper pillar, wherein the MIM capacitor covers and contacts the fourth copper pillar.

3. The interposer with an MIM capacitor of claim 1, wherein the MIM capacitor comprises a bottom electrode, a capacitor dielectric layer and a top electrode stacked in sequence from bottom to top, the bottom electrode contacts the first copper pillar, and the top electrode contacts the second bonding bump.

4. The interposer with an MIM capacitor of claim 3, wherein the bottom electrode comprises titanium nitride or tantalum nitride, and the top electrode comprises nickel, cobalt or cobalt-tungsten alloy.

5. The interposer with an MIM capacitor of claim 3, further comprising a stacked structure covering and contacting a sidewall of the third copper pillar, wherein the stacked structure is formed by stacking a first conductive layer, an insulating layer and a second conductive layer, the first conductive layer contacts the third copper pillar, material of the first conductive layer is the same as material of the bottom electrode, material of the insulating layer is the same as material of the capacitor dielectric layer, and material of the second conductive layer is the same as material of the top electrode.

6. The interposer with an MIM capacitor of claim 1, further comprising a through via penetrating the substrate, wherein the through via electrically connects to the redistribution layer.

7. The interposer with an MIM capacitor of claim 1, wherein the first bonding bump comprises tin.

8. The interposer with an MIM capacitor of claim 1, wherein the second copper pillar is isolated from the redistribution layer.

9. A fabricating method of an interposer with a metal-insulator-metal (MIM) capacitor, comprising:
- providing a substrate;
- forming a redistribution layer on the substrate;
- forming a through via penetrating the substrate, wherein the through via electrically connects to the redistribution layer;
- forming a first copper pillar, a second copper pillar and a third copper pillar simultaneously on the redistribution layer, wherein the first copper pillar and the third copper pillar respectively electrically connect to the redistribution layer;
- forming a first conductive layer, an insulating layer and a second conductive layer in sequence, wherein the first conductive layer, the insulating layer and the second conductive layer cover the first copper pillar, the second copper pillar and the third copper pillar from bottom to top;

segmenting the first conductive layer, the insulating layer and the second conductive layer to form an interval between the first copper pillar and the third copper pillar so as to make the first conductive layer, the insulating layer and the second conductive layer which cover the first copper pillar and the second copper pillar form an MIM capacitor, and the first conductive layer, the insulating layer and the second conductive layer which cover the third copper pillar form a stacked structure; and forming a first bonding bump and a second bonding bump, the first bonding bump disposed directly on the third copper pillar and electrically connecting to the third copper pillar, and the second bonding bump disposed directly on the second copper pillar and electrically connecting to the MIM capacitor.

10. The fabricating method of an interposer with an MIM capacitor of claim 9, further comprising when forming the first copper pillar, the second copper pillar and the third copper pillar, forming a fourth copper pillar, wherein the fourth copper pillar is disposed between the first copper pillar and the second copper pillar, and the MIM capacitor covers and contacts the fourth copper pillar.

11. The fabricating method of an interposer with an MIM capacitor of claim 9, wherein the first conductive layer comprises titanium nitride or tantalum nitride, and the second conductive layer comprises nickel, cobalt or cobalt-tungsten alloy.

* * * * *